US012809765B2

(12) United States Patent
Liu et al.

(10) Patent No.: US 12,809,765 B2
(45) Date of Patent: Nov. 24, 2026

(54) MEMORY DEVICE, OPERATION METHOD THEREOF, AND MEMORY SYSTEM

(71) Applicant: YANGTZE MEMORY TECHNOLOGIES CO., LTD., Wuhan (CN)

(72) Inventors: Yanlan Liu, Wuhan (CN); Bo Li, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 18/745,004

(22) Filed: Jun. 17, 2024

(65) Prior Publication Data

US 2025/0298740 A1 Sep. 25, 2025

(30) Foreign Application Priority Data

Mar. 19, 2024 (CN) ........................ 202410316999.4

(51) Int. Cl.
*G06F 12/02* (2006.01)
*G11C 16/04* (2006.01)
*G11C 16/26* (2006.01)

(52) U.S. Cl.
CPC ...... *G06F 12/0246* (2013.01); *G11C 16/0483* (2013.01); *G11C 16/26* (2013.01)

(58) Field of Classification Search
CPC .. G06F 12/0246; G11C 16/0483; G11C 16/26
See application file for complete search history.

(56) References Cited

U.S. PATENT DOCUMENTS 11,238,940 B1 * 2/2022 Pollio .................... G11C 16/20
11,373,709 B2 * 6/2022 Kim ....................... G11C 16/16
2004/0215857 A1 * 10/2004 Takeuchi ............. G06F 13/364 710/113
2015/0074304 A1 * 3/2015 Adkins ............... G06F 13/4068 710/110
2020/0174687 A1 * 6/2020 Lee ....................... G06F 3/0656
2021/0026620 A1 * 1/2021 Rosner .................... G06F 8/654
2021/0312989 A1 * 10/2021 Yun ...................... G11C 29/021
2022/0238145 A1 * 7/2022 Rao ....................... G11C 7/1078
2022/0310174 A1 * 9/2022 Deng ..................... G11C 16/24
2024/0029793 A1 * 1/2024 Li ........................... G11C 5/14

FOREIGN PATENT DOCUMENTS

CN 103430160 A * 12/2013 ......... G06F 12/0246

OTHER PUBLICATIONS

CN-103430160 translation (Year: 2013).*

* cited by examiner

*Primary Examiner* — Zhuo H Li
(74) *Attorney, Agent, or Firm* — Conley Rose, P.C.

(57) ABSTRACT

Examples of the present application provide a memory device, an operation method thereof, and a memory system. The memory device includes: a memory cell array and a peripheral circuit coupled with the memory cell array, wherein the memory cell array includes N planes, and the N is a positive integer greater than 1; and the peripheral circuit includes N processors corresponding to the N planes, each of the processors is configured with a corresponding internal memory, the N processors include one master processor and N−1 slave processors, and the N−1 internal memories corresponding to the N−1 slave processors have the same bus address.

20 Claims, 9 Drawing Sheets

MEMORY DEVICE, OPERATION METHOD THEREOF, AND MEMORY SYSTEM

CROSS-REFERENCE TO RELATED APPLICATIONS

The present application claims priority to Chinese Patent Application No. 2024103169994, which was filed Mar. 19, 2024, is titled "MEMORY DEVICE, OPERATION METHOD THEREOF, AND MEMORY SYSTEM," and is hereby incorporated herein by reference in its entirety.

TECHNICAL FIELD

Examples of the present application relate to the technical field of semiconductors, and particularly to a memory device, an operation method thereof, and a memory system.

BACKGROUND

A memory device is a memory apparatus for saving information in the modern information technology. As a typical non-volatile semiconductor memory, a not-and (NAND) flash memory has become a mainstream product in the memory market as it has a high storage density, controllable production costs, appropriate code and erase speeds, and a retention characteristic.

SUMMARY

Examples of the present application propose a memory device, an operation method thereof, and a memory system.

In a first aspect, examples of the present application provide a memory device. The memory device comprises a memory cell array and a peripheral circuit coupled with the memory cell array, wherein the memory cell array comprises N planes, and the N is a positive integer greater than 1; and the peripheral circuit comprises N processors corresponding to the N planes, each of the processors is configured with a corresponding internal memory, the N processors comprise one master processor and N−1 slave processors, and the N−1 internal memories corresponding to the N−1 slave processors have the same bus address.

In some examples, the N−1 slave processors are configured to simultaneously receive instruction set data through a bus in a reset operation process, and provide asynchronous multi-plane independent (AMPI) read control signals for a respective plane of the N−1 planes based on the instruction set data in an AMPI read operation process.

In some examples, the internal memory corresponding to the master processor is coupled with the bus, and a bus address of the internal memory corresponding to the master processor is a first bus address. The N−1 internal memories corresponding to the N−1 slave processors are interconnected and all coupled with the bus, and bus addresses of the N−1 internal memories corresponding to the N−1 slave processors are all a second bus address.

In some examples, the peripheral circuit further comprises a host process processor. The host process processor is coupled with the bus and is configured to acquire, in response to a reset instruction, instruction set data from the memory cell array, send, through the bus, instruction set data of the acquired instruction set data matched with the first bus address into the master processor, and simultaneously send the instruction set data matched with the second bus address into the N−1 slave processors.

In some examples, the master processor is configured to provide an AMPI read control signal for the plane corresponding to the master processor in the AMPI read operation process, and provide a non-AMPI read control signal for each of the N planes in the non-AMPI read operation process. The peripheral circuit further comprises a multiplexing circuit, wherein the multiplexing circuit is coupled with the N processors and the N planes and is configured to output each of the N AMPI read control signals from the corresponding one of the N processors to the respective plane in the AMPI read operation process, and output the non-AMPI read control signal from the master processor to each plane in the non-AMPI read operation process.

In some examples, the peripheral circuit further comprises an interface. The interface is coupled with the multiplexing circuit, and is configured to control the multiplexing circuit to output each AMPI read control signal from the corresponding processor to the respective plane in the AMPI read operation process, and output the non-AMPI read control signal from the master processor to each plane in the non-AMPI read operation process.

In some examples, each plane is configured to independently and asynchronously perform a read operation in response to receiving the AMPI read control signal. The non-AMPI read operation comprises a synchronous multi-plane independent (SMPI) read operation. Each plane is also configured to independently and synchronously perform the read operation in response to receiving an SMPI read control signal.

In some examples, the multiplexing circuit comprises N multiplexers. A first input end of each of the N multiplexers is configured to receive the non-AMPI read control signal from the master processor. A second input end of each multiplexer is configured to receive the AMPI read control signal from the master processor or a slave processor. An output end of each multiplexer is coupled with a respective one of the N planes.

In some examples, the interface comprises an instruction decoder. The instruction decoder is configured to control, in response to receiving an AMPI read instruction, the master processor and the slave processor to generate a corresponding AMPI read control signal based on the AMPI read instruction, and control the multiplexer to output the corresponding AMPI read control signal received from the second input end. The instruction decoder is further configured to control, in response to receiving a non-AMPI read instruction, the master processor to generate the non-AMPI read control signal based on the non-AMPI read instruction, and control each multiplexer to output the non-AMPI read control signal received from the first input end.

In some examples, each of the processors is configured with a corresponding register group, and the N−1 register groups corresponding to the N−1 slave processors have different bus addresses. The register group is configured to store an address of an instruction to be executed currently.

In some examples, the internal memory comprises a random access memory (RAM).

In a second aspect, examples of the present application further provide a memory system. The memory system comprises one or more memory devices provided by the examples of the present application; and a memory controller coupled with and controlling the memory devices.

In a third aspect, examples of the present application further provide an operation method of a memory device. The operation method comprises: simultaneously receiving, by N−1 slave processors in a peripheral circuit of the memory device, instruction set data through a bus in a reset operation process, wherein a memory cell array of the memory device comprises N planes, the N is a positive integer greater than 1, the peripheral circuit comprises N processors corresponding to the N planes, and N−1 internal memories corresponding to the N−1 slave processors of the N processors have the same bus address; and providing AMPI read control signals for a respective plane of the N−1 planes based on the instruction set data in an AMPI read operation process after the reset operation.

In some examples, the operation method further comprises: acquiring, by a host process processor in the peripheral circuit, instruction set data at least from the memory cell array in response to a reset instruction; and sending, through the bus, instruction set data of the acquired instruction set data matched with a first bus address into the master processor of the N processors, and simultaneously sending the instruction set data matched with a second bus address into the N−1 slave processors.

In some examples, the operation method further comprises: acquiring, by the N−1 slave processors, an address of an instruction to be executed currently through corresponding N−1 register groups in the AMPI operation process, wherein the N−1 register groups corresponding to the N−1 slave processors have different bus addresses.

In some examples, the operation method further comprises: providing, by the master processor of the N processors, the AMPI read control signal for the plane corresponding to the master processor in the AMPI read operation process; providing a non-AMPI read control signal for each of the N planes in the non-AMPI read operation process; outputting, by a multiplexing circuit in the peripheral circuit, each of the N AMPI read control signals from the corresponding one of the N processors to the respective plane in the AMPI read operation process; and outputting the non-AMPI read control signal from the master processor to each plane in the non-AMPI read operation process.

In the various examples in the present application, the internal memories of all the slave processors corresponding to the planes share one bus address. In a reset stage, the instruction set data for all the slave processors is loaded simultaneously, such that each plane is separately controlled without increasing an address bus width in the AMPI read operation process, while the data of all the slave processors is written, thereby reducing a duration of the reset stage and improving the performance of the memory device.

BRIEF DESCRIPTION OF THE DRAWINGS

In the accompanying drawings, unless otherwise specified, identical or similar components or elements are represented by like reference numerals throughout several drawings. These drawings are not necessarily drawn to scale. It is to be understood that, these drawings merely describe some implementations applied according to the present application, and should not be considered as limitations to the scope of the present application.

DETAILED DESCRIPTION

Figure 1:
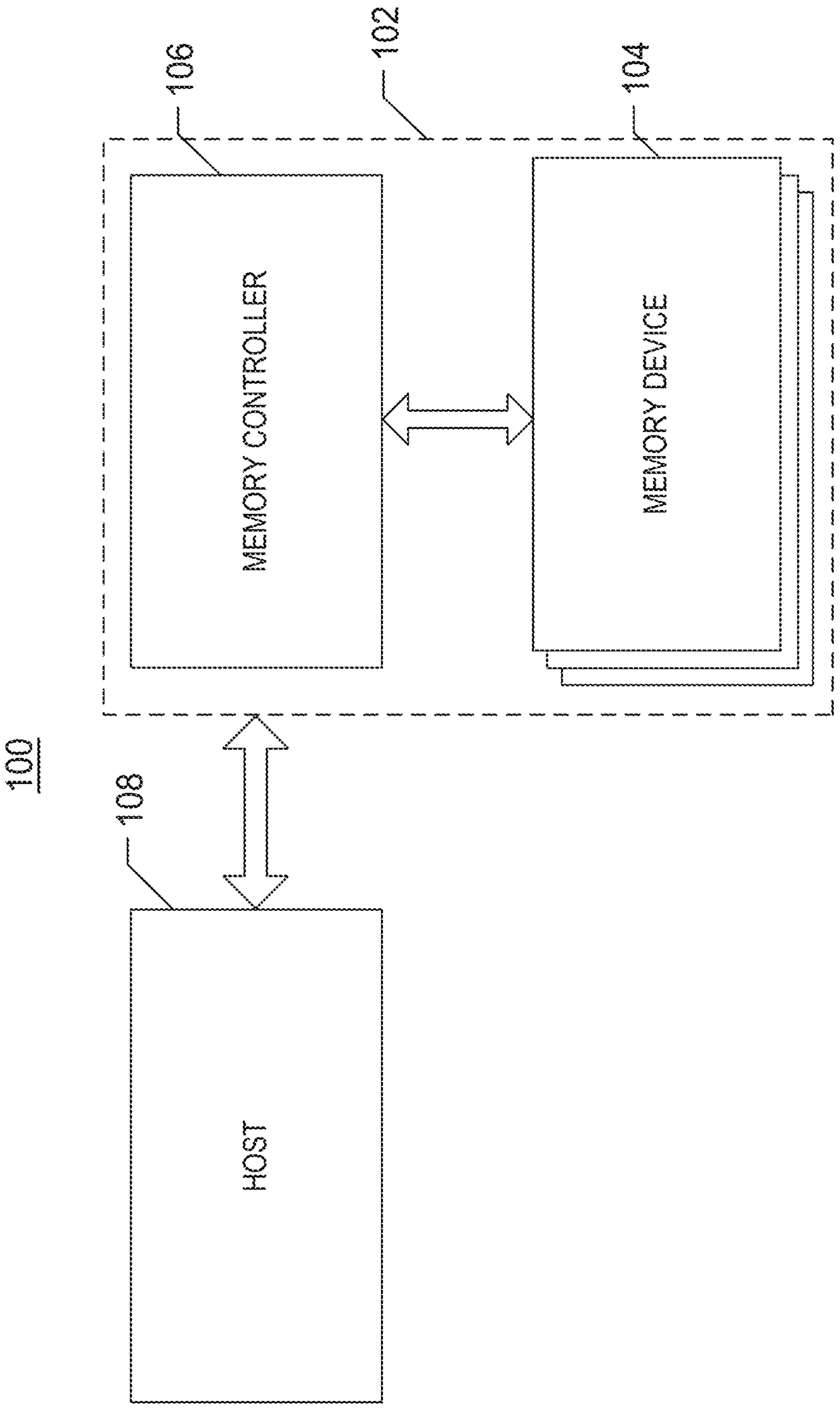
FIG. 1 is a schematic diagram of an example system having a memory system according to an example of the present application.

Example implementations applied by the present application will be described below in more detail with reference to the drawings. Although the example implementations of the present application are shown in the drawing, it is to be understood that, the present application may be implemented by various forms without being limited by the implementations as set forth herein. On the contrary, these implementations are provided for a more thorough understanding of the present application, and to fully convey a scope of the present application to those skilled in the art.

In the following descriptions, a lot of details are given in order to provide the more thorough understanding of the present application. However, it is apparent to those skilled in the art that the present application may be implemented without one or more of these details. In other examples, in order to avoid confusion with the present application, some technical features well-known in the art are not described. That is, all the features of the actual examples are not described herein, and well-known functions and structures are not described in detail.

In the drawings, the sizes of a layer, a region, and an element and their relative sizes may be exaggerated for clarity. Like reference numerals denote like elements throughout the specification.

It is to be understood that when an element or a layer is referred to as being "on", "adjacent to", "connected to", or "coupled to" other elements or layers, it may be directly on, adjacent to, connected to, or coupled to the other elements or layers, or intervening elements or layers may be present. In contrast, when an element is referred to as being "directly on", "immediately adjacent to", "directly connected to", or "directly coupled to" other elements or layers, no intervening elements or layers are present. It should be understood that, although the terms first, second, third, etc., may be used to describe various elements, components, areas, layers and/or portions, these elements, components, areas, layers and/or portions should not be limited by these terms. These terms are only used to distinguish one element, component, area, layer or portion from another element, component, area, layer or portion. Therefore, without departing from the teaching of the present application, a first element, component, area, layer, or portion discussed below may be represented as a second element, component, area, layer, or portion. While the second element, component, area, layer, or portion is discussed, it does not mean that the first element, component, area, layer, or portion is necessarily present in the present application.

Spatial relation terms, such as "beneath", "below", "lower", "under", "above", "upper" and the like, may be used here for conveniently describing so that a relationship between one element or feature shown in the drawings and other elements or features is described. It should be understood that in addition to orientations shown in the drawings, the spatial relationship terms are intended to further include the different orientations of a device in use and operation. For example, if the device in the drawing is turned over, then the elements or the features described as "below" or "under" or "beneath" other elements may be oriented "on" the other elements or features. Therefore, the example terms "below" and "beneath" may comprise both upper and lower orientations. The device may be otherwise oriented (rotated by 90 degrees or other orientations), and the spatial descriptions used here are interpreted accordingly.

A purpose of the terms used here is only to describe examples and not as a limitation to the present application. As used herein, unless otherwise indicated expressly in the context, "a", "an" and "the" in a singular form are also intended to comprise a plural form. It is also to be understood that the terms "comprised of" and/or "comprise", when used in this specification, determine the presence of a feature, integer, step, operation, element and/or component, but do not preclude the presence or addition of one or more of other features, integers, steps, operations, elements, components, and/or groups. As used herein, a term "and/or" comprises any and all combinations of related items listed.

In order to understand the features and technical contents of the examples of the present application in more detail, the implementation of the examples of the present application are described in detail below with reference to the drawings, which are for reference only and are not intended to limit the examples of the present application.

Some memory devices, such as a NAND memory device, may perform read operations on a page level, e.g., simultaneously reading all memory cells in a same selected page. The page may belong to a block, and the block may belong to a plane. It should be understood that a single plane may be controlled to perform read or program operations, and meanwhile, based on hardware conditions, a plurality of planes may be controlled to perform read or program operations in parallel, thereby increasing an operation speed.

In some examples, a multi-plane read operation may be performed in a synchronous manner between different planes, and such read manner is referred to as an SMPI read operation. However, when the memory device is busy (e.g., when a ready/busy (R/B_n) signal is set to zero), the SMPI read operation does not allow a host to send a read instruction to the memory system. As a result, the performance of a memory system is limited. In some other examples, the multi-plane read operation may be performed in a non-synchronous manner between different planes, and such read manner is referred to as an AMPI read operation. Since the AMPI read operation allows the host to send the read instruction to the memory system when the memory device is busy, the performance of the system can be improved.

In some examples, the AMPI read operation is implemented based on a hardware basis of a master processor and a slave processor (or referred to as a coprocessor). The master processor processes non-asynchronous independent read like traditional multi-plane read and controls one plane during the AMPI read operation; and the slave processor controls the remaining planes respectively during the AMPI read operation.

Each processor is configured with its own independent internal memory configured to store instructions. In a power-on reset (POR) stage of the processor, the instruction is loaded from the block configured in the memory device into the internal memory through a bus. In an example, the bus on the apparatus mainly has an 8-bit width. In order to improve the performance, it is necessary to utilize an address space to a maximum extent, reduce routing resources, and save data loading time in the POR stage.

However, with the increase in the number of functional functions in firmware/software codes and the planes, the address space of the bus becomes insufficient, and expanding a width of the address bus will increase the routing resources. Meanwhile, a duration required to load data in the POR stage is increased, which will affect the performance.

In some examples, in the case where one processor (the master processor or the slave processor) controls one plane, the greater the number of the planes is, the greater the number of processors that need to be configured is, and the greater the number of internal memories of the corresponding processors is. All the internal memories need to load data through the bus, which occupies the address space of the bus, leading to the insufficient address space of the bus. Meanwhile, data loading for these internal memories is done one by one, thereby significantly increasing the duration of the POR stage.

In order to solve at least one of the above-mentioned problems, examples of the present application relate to a solution in which internal memories of all slave processors corresponding to planes share one bus address, and instruction set data of all the slave processors is loaded simultaneously in the POR stage, such that each plane can be separately controlled without increasing the address bus width in the AMPI read operation process, and the data of all the slave processors can be written simultaneously, thereby reducing the duration of the POR stage.

The memory device provided by the examples of the present application may comprise: a memory cell array and a peripheral circuit coupled with the memory cell array, wherein the memory cell array comprises N planes, and N is a positive integer greater than 1; and the peripheral circuit comprises N processors corresponding to the N planes, each of the processors is configured with a corresponding internal memory, the N processors comprise one master processor and N−1 slave processors, and the N−1 internal memories corresponding to the N−1 slave processors have the same bus address.

Consistent with the application scope of the examples of the present application, a single master processor has the versatility and flexibility to control any non-AMPI read operation (e.g., SMPI read, program, or erase) of the plurality of planes in a synchronous manner. The examples of the present application relate to various designs based on an architecture of the master processor. According to some aspects applied by the examples of the present application, the master processor may be also configured to control the AMPI read operation of one plane, thereby increasing a utilization rate of the master processor.

FIG. 1 illustrates a block diagram of an example system 100 having a memory device according to some aspects of the present application. The system 100 may comprise a mobile phone, a desktop computer, a laptop computer, a tablet computer, a vehicle computer, a gaming console, a printer, a positioning apparatus, a wearable electronic apparatus, a smart sensor, a virtual reality (VR) apparatus, an augmented reality (AR) apparatus, or any other suitable electronic apparatus having a memory. As shown in FIG. 1, the system 100 may comprise a host 108 and a memory system 102, wherein the memory system 102 has one or more memory devices 104 and a memory controller 106. The host 108 may be a control section (e.g., a central processing unit (CPU)) of an electronic apparatus, or a system on chip (SoC) (e.g., an application processor (AP)). The host 108 may be configured to send or receive data to or from the memory device 104.

According to some implementations, the memory controller 106 is coupled to the memory device 104 and the host 108, and is configured to control the memory device 104. The memory controller 106 may manage the data stored in the memory device 104, and communicate with the host 108. In some implementations, the memory controller 106 is designed for operating in a low duty-cycle environment, such as a secure digital (SD) card, a compact flash (CF) card, a universal serial bus (USB) flash drive, or other media for use in an electronic apparatus, such as a personal computer, a digital camera, a mobile phone, etc.

In some implementations, the memory controller 106 is designed for operating in high duty-cycle environment of solid state disks (SSD) or embedded multi-media cards (eMMC) used as data memories for mobile apparatuses, such as smartphones, tablets, laptop computers, etc., and enterprise memory arrays.

The memory controller 106 may be configured to control operations of the memory device 104, such as read, erase, and program operations. The memory controller 106 may be further configured to manage various functions with respect to data stored or to be stored in the memory device 104, including, but not limited to, bad-block management, garbage collection, logical-to-physical address conversion, wear leveling, etc. In some implementations, the memory controller 106 is further configured to process an error correction code with respect to the data read from or written to the memory device 104.

The memory controller 106 may further perform any other suitable functions, for example, formatting the memory device 104. The memory controller 106 may communicate with an external apparatus (e.g., the host 108) according to a communication protocol. For example, the memory controller 106 may communicate with the external apparatus through at least one of various interface protocols, such as a USB protocol, an MMC protocol, a Peripheral Component Interconnection (PCI) protocol, a PCI Express (PCI-E) protocol, an Advanced Technology Attachment (ATA) protocol, a serial-ATA protocol, a parallel-ATA protocol, a Small Computer Small Interface (SCSI) protocol, an Enhanced Small Disk Interface (ESDI) protocol, an Integrated Drive Electronics (IDE) protocol, a Firewire protocol, etc.

The memory controller 106 and the one or more memory devices 104 may be integrated into various types of storage apparatuses, for example, be included in the same package (e.g., a Universal Flash Storage (UFS) package or an eMMC package). That is to say, the memory system 102 may be implemented and packaged into different types of end electronic products.

Figure 2B:
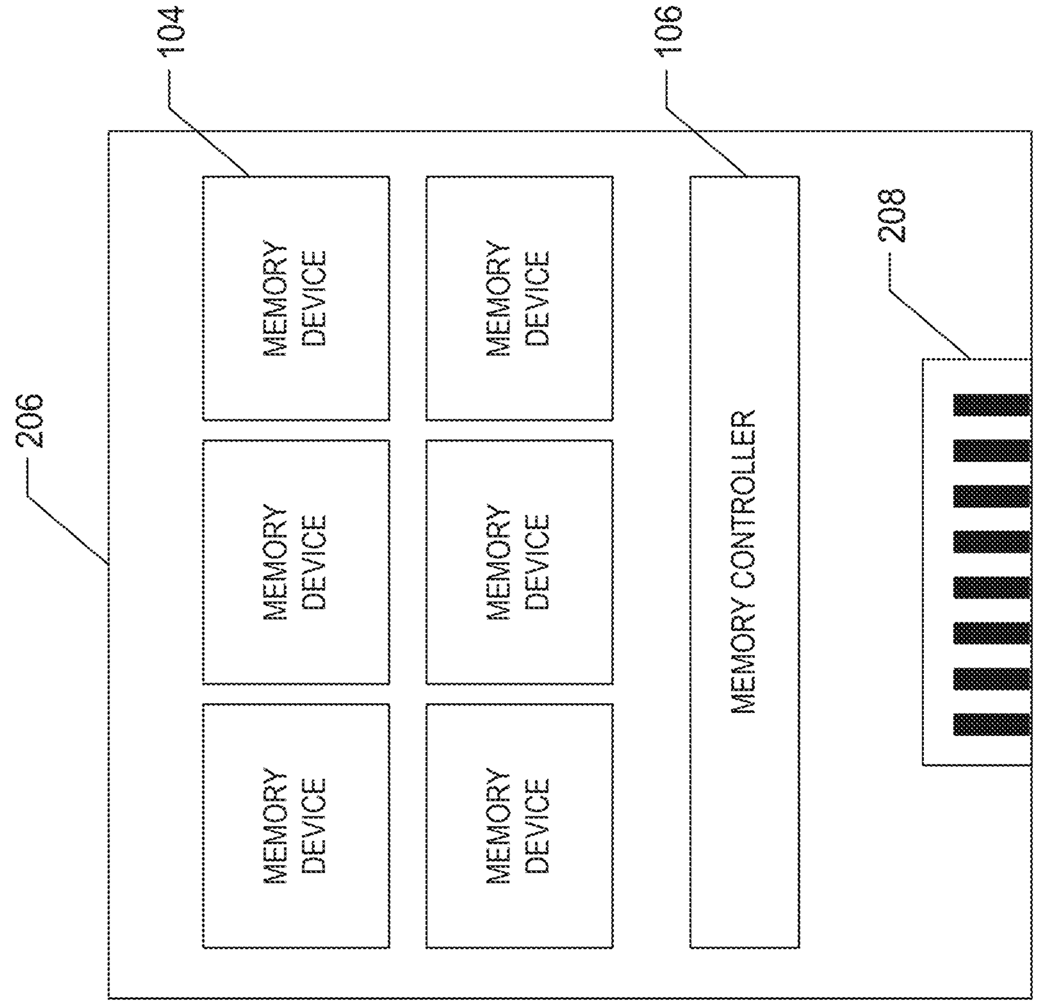
FIG. 2B is a schematic diagram of an example solid-state drive having a memory system according to an example of the present application.
Figure 2A:
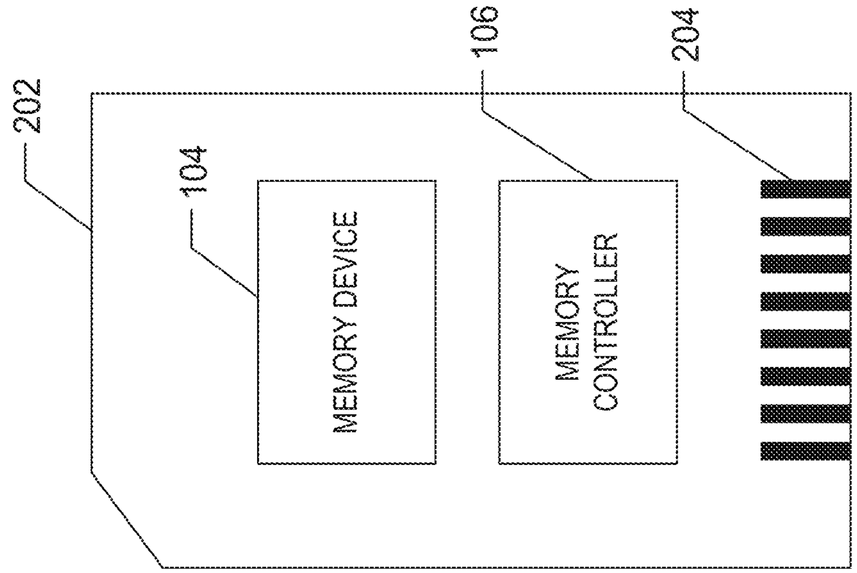
FIG. 2A is a schematic diagram of an example memory card having a memory system according to an example of the present application.

In one example as shown in FIG. 2A, the memory controller 106 and the single memory device 104 may be integrated into a memory card 202. The memory card 202 may comprise a PC card (PCMCIA, Personal Computer Memory Card International Association), a CF card, a smart media (SM) card, a memory stick, a multimedia card (MMC, RS-MMC, and MMCmicro), an SD card (SD, miniSD, microSD, and SDHC), a UFS, etc. The memory card 202 may further comprise a memory card connector 204 coupling the memory card 202 with a host (e.g., the host 108 in FIG. 1).

In another example as shown in FIG. 2B, the memory controller 106 and a plurality of memory devices 104 may be integrated into an SSD 206. The SSD 206 may further comprise an SSD connector 208 coupling the SSD 206 with a host (e.g., the host 108 in FIG. 1). In some implementations, at least one of a storage capacity or an operation speed of the SSD 206 is greater than at least one of a storage capacity or an operation speed of the memory card 202.

In some examples, each block may be coupled to a plurality of word lines, and a plurality of memory cells coupled to each word line form a physical page.

Figure 3:
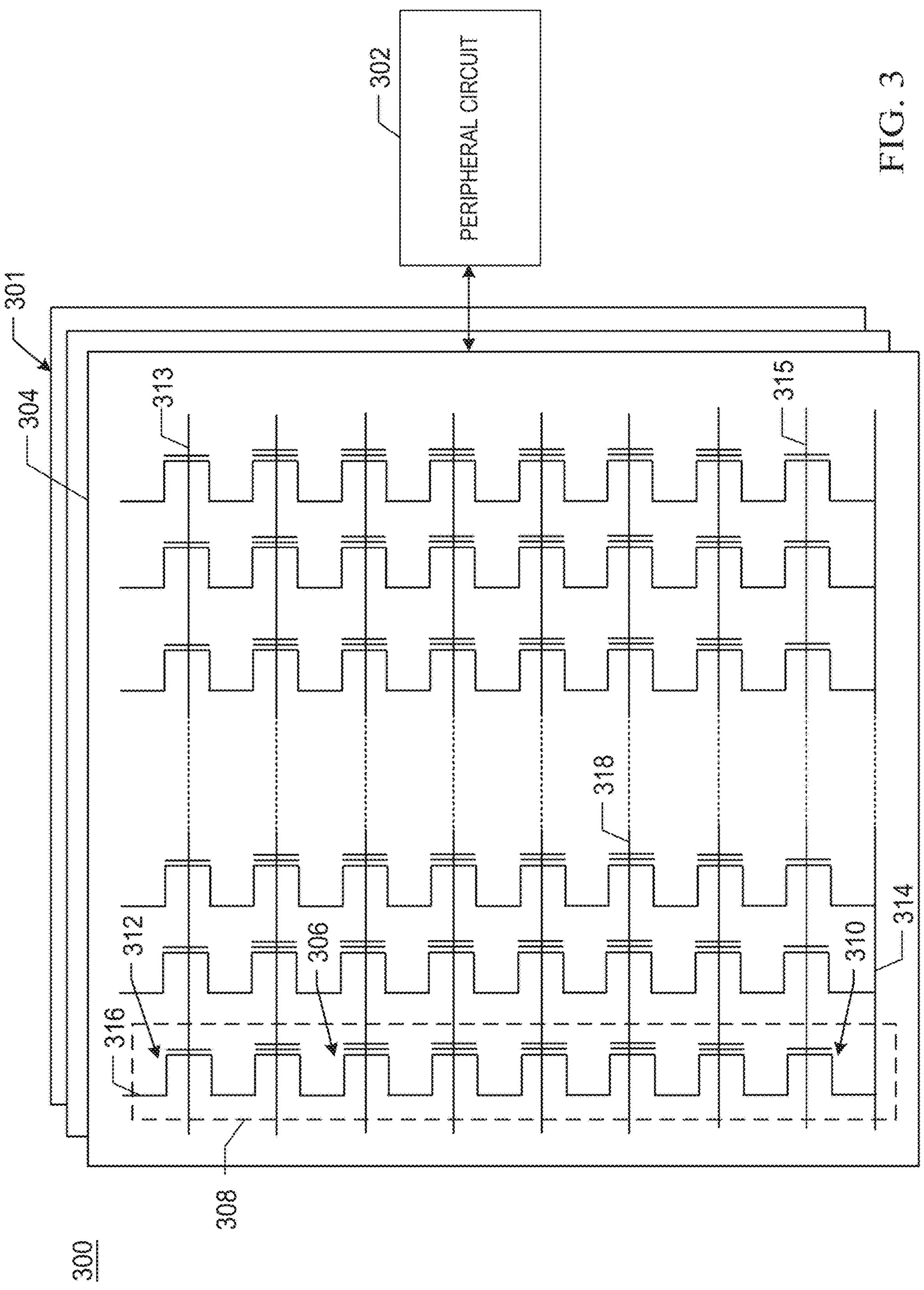
FIG. 3 is a schematic diagram of an example memory comprising a peripheral circuit according to an example of the present application.

FIG. 3 illustrates a schematic circuit diagram of an example memory device 300 comprising a peripheral circuit according to some aspects of the present application. The memory device 300 may be an example of the memory device 104 in FIG. 1. The memory device 300 may comprise a memory cell array 301 and a peripheral circuit 302 coupled to the memory cell array 301. The memory cell array 301 being a three-dimensional NAND memory cell array is taken as an example for illustration, wherein a memory cell 306 is a NAND memory cell; the memory cell 306 is provided in a form of an array of memory strings 308; and each memory string 308 vertically extends above a substrate (not shown). In some implementations, each memory string 308 comprises a plurality of memory cells 306 coupled in series and stacked vertically. Each memory cell 306 may maintain a continuous analog value, such as a voltage or charge, which depends on the number of electrons trapped within a region of the memory cell 306. Each memory cell 306 may be either a floating gate type memory cell that comprises a floating gate transistor, or a charge trapping type memory cell that comprises a charge trapping transistor.

In some implementations, each memory cell 306 is a single-level cell (SLC) that has two possible storage states and thus may store one bit of data. For example, a first storage state "0" may correspond to a first voltage range, and a second storage state "1" may correspond to a second voltage range. In some implementations, each memory cell 306 is a multi-level cell (MLC) that can store more than one bit of data in more than four storage states. For example, the MLC can store two bits per cell (which may be also called a double-level cell), three bits per cell (also called a trinary-level cell (TLC)), four bits per cell (also called a quad-level cell (QLC)), five bits per cell (also called a penta-level cell (PLC)), or more than five bits per cell. Each MLC may be programmed to assume a range of possible nominal storage values. In one example, if each MLC stores two bits of data, the MLC can be programmed to take one of three possible programmed levels from an erased state by writing one of three possible nominal storage values to the cell, and a fourth nominal storage value may be used for the erased state.

It is to be noted that, the storage state described here is the memory state of the memory cell described in the present application. Different memory cells have different numbers of memory states, for example, the SLC-type memory cell has 2 memory states (e.g., two memory states), wherein the 2 memory states comprise one programmed state and one erased state. For another example, the MLC-type memory cell has 4 memory states, wherein the 4 memory states comprise one erased state and three programmed states. For yet another example, the TLC-type memory cell has 8 memory states, wherein the 8 memory states comprise one erased state and seven programmed states. In some implementations, the QLC-type memory cell has 16 memory states, wherein the 16 memory states comprise one erased state and fifteen programmed states.

As shown in FIG. 3, each memory string 308 may comprise a bottom select transistor (BSG) 310 (also referred to as a source side select transistor) at a source terminal thereof and a top select transistor (TSG) 312 (also referred to as a drain side select transistor) at a drain terminal thereof. The BSG 310 and the TSG 312 may be configured to activate a selected memory string 308 during read and program operations. In some implementations, sources of the memory strings 308 in a same block 304 are coupled through a same source line (SL) 314 (e.g., a common SL). For example, according to some implementations, all the memory strings 308 in the same block 304 have an array common source (ACS). According to some implementations, the TSG 312 of each memory string 308 is coupled to a respective bit line (BL) 316, and data may be read or written from the bit line 316 via an output bus (not shown). In some implementations, each memory string 308 is configured to be selected or unselected by applying a select voltage (e.g., above a threshold voltage of a transistor having the TSG 312) or an unselect voltage (e.g., 0 V) to the respective TSG 312 via one or more TSG lines 313 and/or by applying a select voltage (e.g., above a threshold voltage of a transistor having the BSG 310) or an unselect voltage (e.g., 0 V) to the respective BSG 310 via one or more BSG lines 315.

As shown in FIG. 3, the memory strings 308 may be organized into a plurality of blocks 304, and each of the plurality of blocks 304 may have a common source line 314 (e.g., coupled to the ground). In some implementations, each block 304 is a basic data unit for an erase operation, that is, all of the memory cells 306 on the same block 304 are erased at the same time. In order to erase the memory cells 306 in a selected block 304, the source line 314 coupled to the selected block 304 as well as unselected blocks 304 that are in the same plane as the selected block 304 can be biased with an erase voltage (Vers) (e.g., a high positive voltage (e.g., 20 V or higher)). It is to be understood that in some examples, the erase operation may be performed at a half block level, a quarter block level, or a level having any suitable number of blocks or any suitable fraction of a block. The memory cells 306 of adjacent ones of the memory strings 308 may be coupled through word lines 318 that select which row of memory cells 306 is affected by the read and program operations.

Referring to FIG. 3, each of the plurality of memory cells 306 is coupled to the respective word line 318, and each memory string 308 is coupled to the respective bit line 316 through a respective select transistor (e.g., the top select transistor (TSG) 312).

Figure 4:
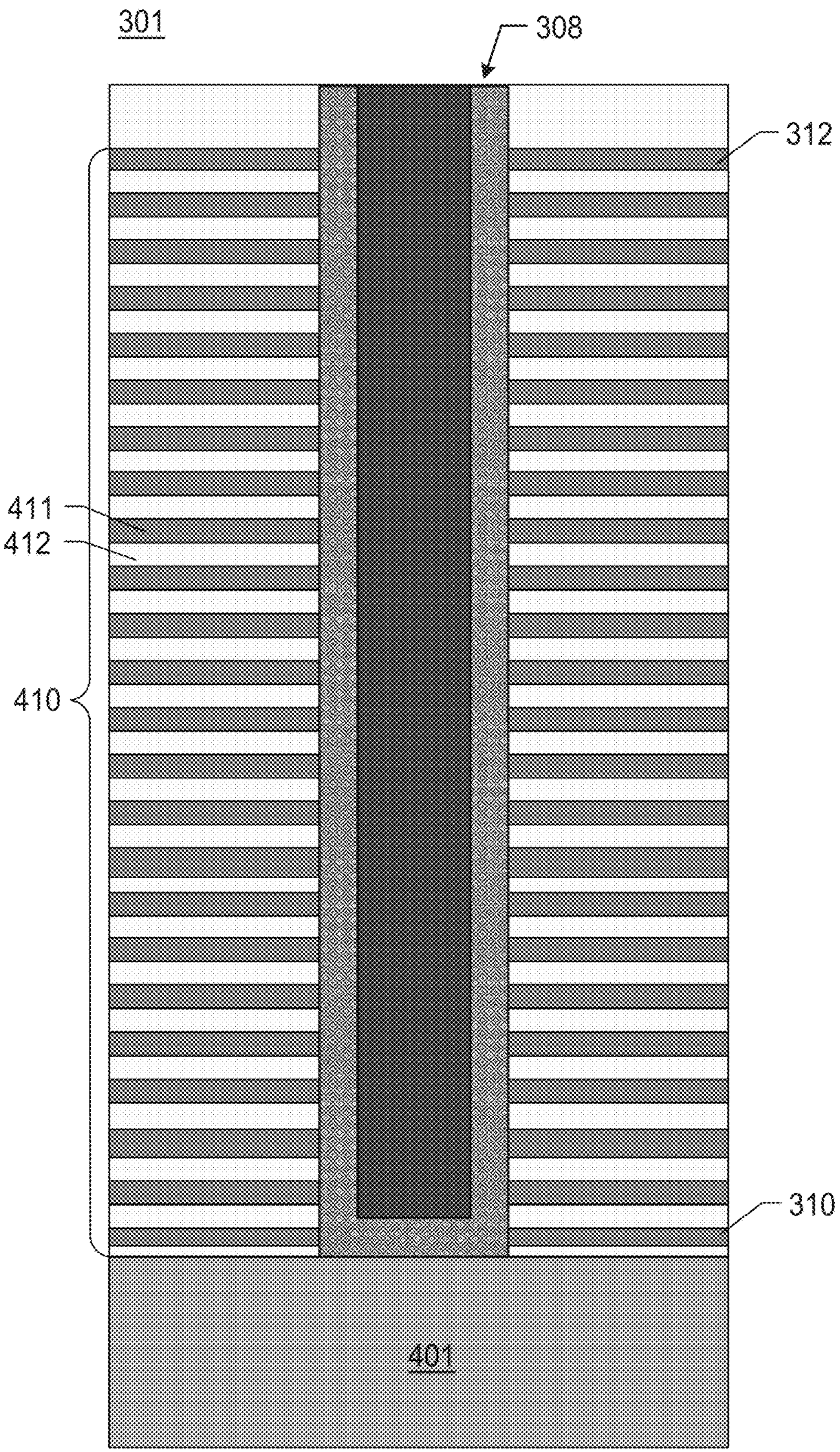
FIG. 4 is a schematic cross-sectional view of a memory cell array comprising a NAND memory string according to an example of the present application.

FIG. 4 illustrates a schematic cross-sectional view of an example memory cell array 301 comprising a memory string 308 with NAND as an example according to some aspects of the present application. As shown in FIG. 4, the NAND memory cell array 301 may comprise a stack structure 410. The stack structure 410 comprises a plurality of gate layers 411 and a plurality of insulation layers 412 that are sequentially and alternately stacked, and a channel structure that penetrates through the gate layers 411 and the insulation layers 412 vertically. The channel structure is coupled with each gate layer to form a memory cell. The channel structure is coupled with the plurality of gate layers in the stack structure 410 to form the memory string 308. The gate layers 411 and the insulation layers 412 may be alternately stacked, and two adjacent ones of the gate layers 411 are spaced apart by one insulation layer 412.

A constituent material of the gate layers 411 may comprise a conductive material. The conductive material includes, but is not limited to, tungsten (W), cobalt (Co), copper (Cu), aluminum (Al), polysilicon, doped silicon, silicides, or any combination thereof. In some implementations, each gate layer 411 comprises a metal layer, such as a tungsten layer. In some implementations, each gate layer 411 comprises a doped polysilicon layer. Each gate layer 411 may comprise a control gate around a memory cell. The gate layer 411 at a top of the stack structure 410 may extend laterally as a top select gate line; the gate layer 411 at a bottom of the stack structure 410 may extend laterally as a bottom select gate line; and the gate layers 411 that extend laterally between the top select gate line and the bottom select gate line may act as word line layers.

In some examples, the stack structure 410 may be disposed on a substrate 401. The substrate 401 may comprise silicon (e.g., single crystalline silicon), silicon germanium (SiGe), gallium arsenide (GaAs), germanium (Ge), silicon on insulator (SOI), germanium on insulator (GOI), or any other suitable materials.

In some examples, the memory string 308 comprises a channel structure that extends through the stack structure 410 vertically. In some implementations, the channel structure comprises a channel hole filled with (one or more) semiconductor materials (e.g., as a semiconductor channel) and (one or more) dielectric materials (e.g., as a memory film). In some implementations, the semiconductor channel comprises silicon, such as polysilicon. In some implementations, the memory film is a composite dielectric layer comprising a tunneling layer, a storage layer (also referred to as a "charge trapping/storage layer"), and a blocking layer. The channel structure may have a cylindrical shape (e.g., a pillar shape). According to some implementations, the semiconductor channel, the tunneling layer, the storage layer, and the blocking layer are arranged radially from a center of a pillar toward an outer surface of the pillar in this order. The tunneling layer may comprise silicon oxide, silicon oxynitride, or any combination thereof. The storage layer may comprise silicon nitride, silicon oxynitride, or any combination thereof. The blocking layer may comprise silicon oxide, silicon oxynitride, a high dielectric constant (high-k) dielectric, or any combination thereof. In one example, the memory film may comprise a composite layer of silicon oxide/silicon oxynitride/silicon oxide (ONO).

Figure 5:
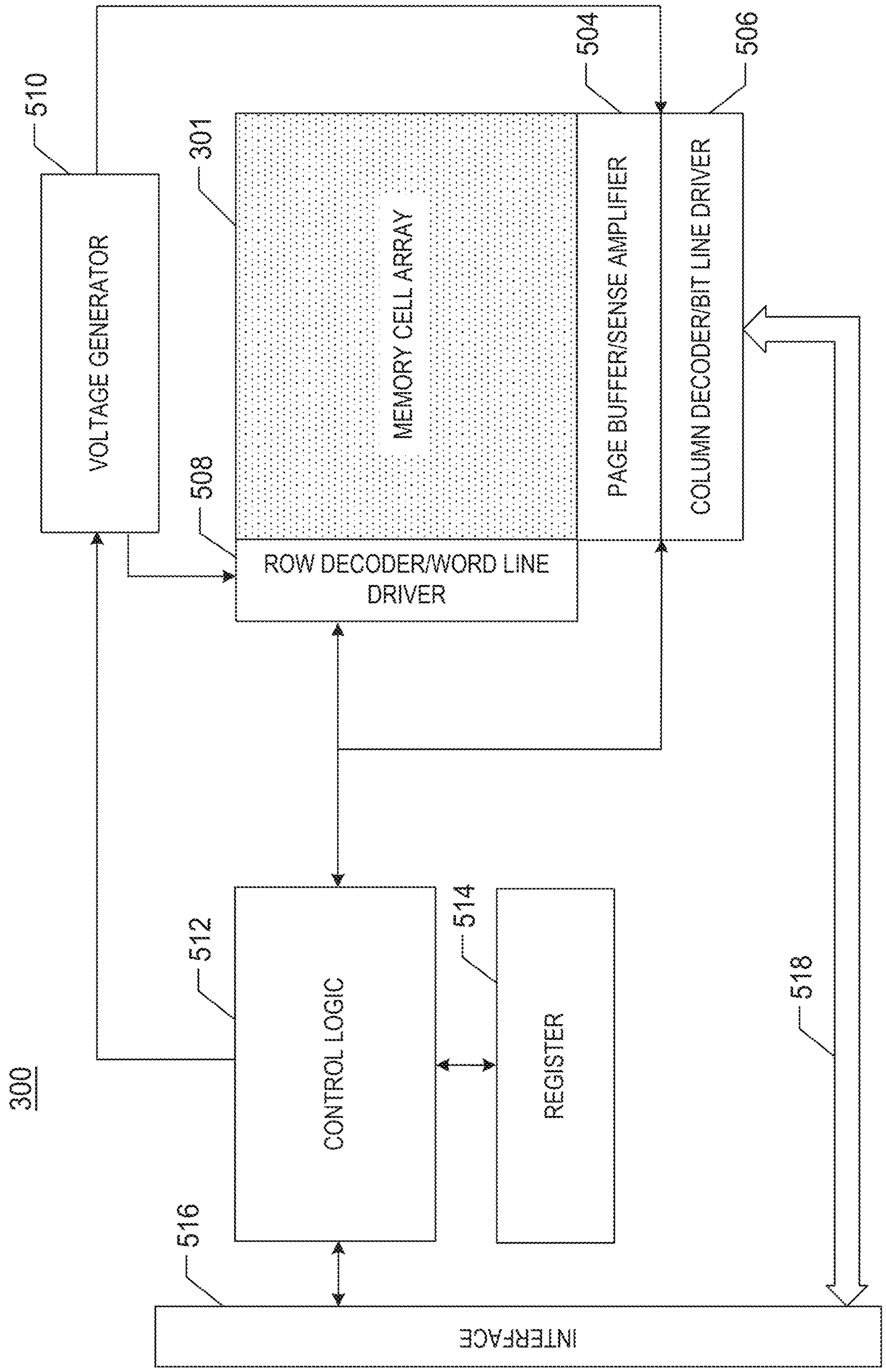
FIG. 5 is a schematic diagram of an example memory device comprising a memory cell array and a peripheral circuit according to an example of the present application.

Referring back to FIG. 3, the peripheral circuit 302 may be coupled to the memory cell array 301 through the bit lines 316, the word lines 318, the source lines 314, the BSG lines 315, and the TSG lines 313. The peripheral circuit 302 may comprise any suitable analog, digital, and hybrid signal circuits for facilitating the operations of the memory cell array 301 by applying and sensing at least one of voltage signals or current signals to and from each target memory cell 306 via the bit lines 316, the word lines 318, the source lines 314, the BSG lines 315, and the TSG lines 313. The peripheral circuit 302 may comprise various types of peripheral circuits formed using a metal-oxide-semiconductor (MOS) technology. For example, FIG. 5 illustrates some example peripheral circuits. The peripheral circuit comprises a page buffer/sense amplifier 504, a column decoder/bit line driver 506, a row decoder/word line driver 508, a voltage generator 510, a control logic 512, a register 514, an interface 706, and a data bus 518. It is to be understood that, in some examples, additional peripheral circuits not shown in FIG. 5 may be comprised as well.

The page buffer/sense amplifier 504 may be configured to read and program (write) data from and to the memory cell array 301 according to a control signal from the control logic 512. In one example, the page buffer/sense amplifier 504 may store program data (write data) to be programmed to the memory cell array 301. In another example, the page buffer/sense amplifier 504 may perform a program verify operation to ensure that the data has been properly programmed into the memory cells 306 coupled to the selected word line 318. In yet another example, the page buffer/sense amplifier 504 may also sense a low power signal from the bit line 316 that represents a data bit stored in the memory cells 306, and amplifies a small voltage swing to a recognizable logic level in the read operation. The column decoder/bit line driver 506 may be configured to be controlled by the control logic 512 and select one or more memory strings 308 by applying a bit line voltage generated from the voltage generator 510.

The row decoder/word line driver 508 may be configured to be controlled by the control logic 512, select/unselect the blocks 304 of the memory cell array 301, and select/unselect the word lines 318 of the blocks 304. The row decoder/word line driver 508 may be further configured to drive the word line 318 using a word line voltage generated from the voltage generator 510. In some implementations, the row decoder/word line driver 508 may also select/unselect and drive the BSG line 315 and the TSG line 313. As described below in detail, the row decoder/word line driver 508 is configured to perform the program operation on the memory cells 306 that are coupled to (one or more) selected word lines 318. The voltage generator 510 may be configured to be controlled by the control logic 512 and generate a word line voltage (e.g., a read voltage, a program voltage, a pass voltage, a channel boost voltage, a verify voltage, etc.), a bit line voltage, and a source line voltage to be supplied to the memory cell array 301.

The control logic 512 may be coupled to each of other portions in the peripheral circuit described above, and configured to control operations of each of the other portions in the peripheral circuit. The register 514 may be coupled to the control logic 512 and comprise a state register, a command register, and an address register for storing state information, a command operation code (OP code), and a command address for controlling the operation of each peripheral circuit. The interface 706 may be coupled to the control logic 512, and act as a control buffer to buffer and relay control commands received from a host (not shown) to the control logic 512 and state information received from the control logic 512 to the host. The interface 706 may be also coupled to the column decoder/bit line driver 506 via the data bus 518 and act as a data I/O interface and a data buffer to buffer and relay the data to and from the memory cell array 301.

Figure 6:
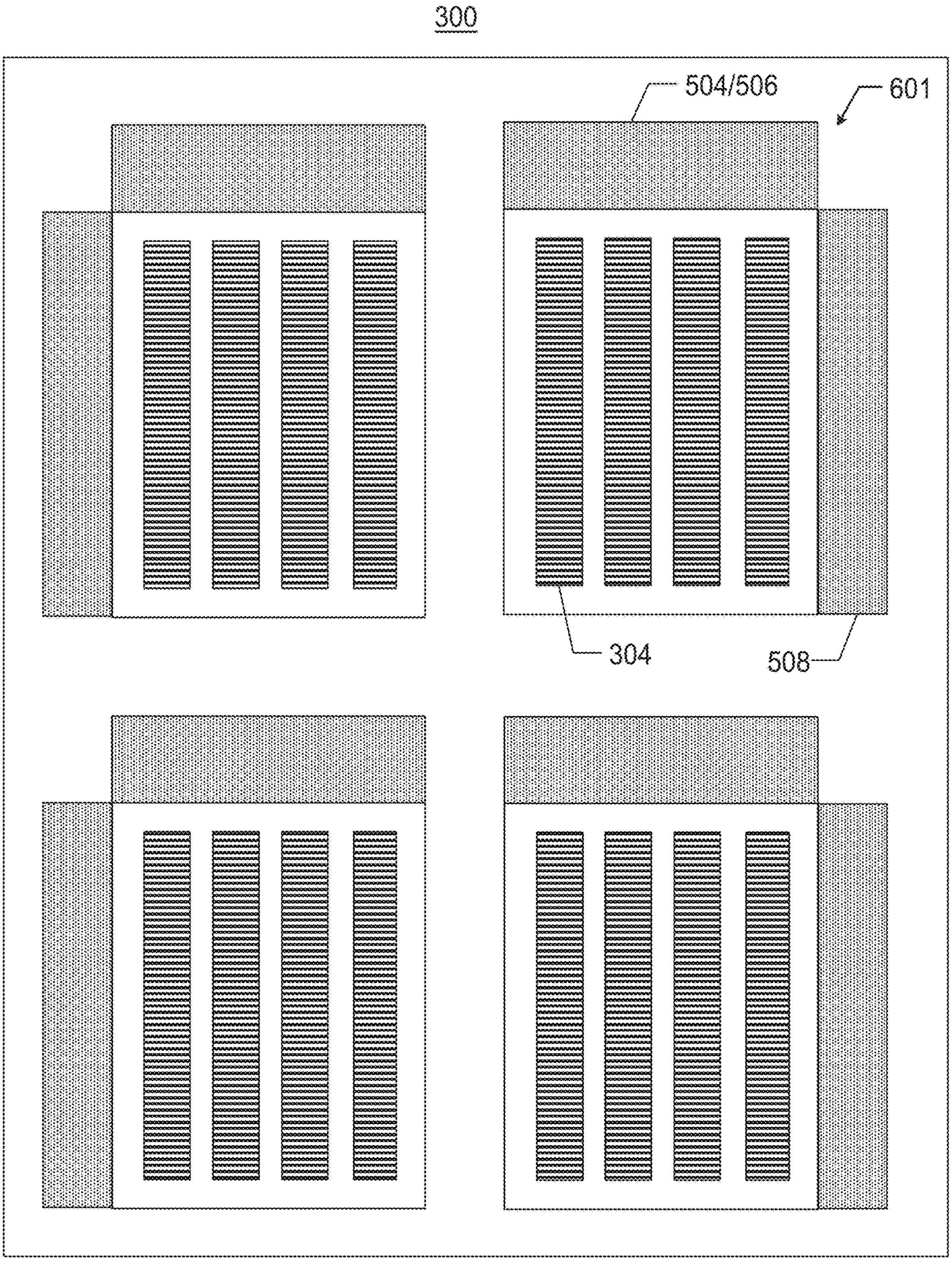
FIG. 6 is a schematic diagram of an example memory device comprising planes according to an example of the present application.

FIG. 6 is a schematic diagram of an example memory device comprising planes according to an example of the present application. In some examples, the memory device 300 comprises a plurality of planes 601, e.g., N planes, wherein N is an integer greater than 1 (e.g., 4 in FIG. 6). The planes 601 can be independent of each other when performing read, program, or erase operations. For example, each plane 601 may be configured to independently perform the read operation in response to receiving a read control signal from the control logic 512. In some implementations, each plane 601 covers a local buffer for reading and programming data, and may perform processing operations in parallel, thereby increasing an operation speed. In order to enable an independent operation of each plane 601, each plane 601 may comprise a set of blocks 304 of the memory cell array 301 and a set of circuits, such as the page buffer/sense amplifier 504, the column decoder/bit line driver 506, and the row decoder/word line driver 508.

By separating the memory device 300 into the independent planes 601, a multi-plane independent read operation, e.g., an SMPI read operation, may be performed in a synchronous manner; or a multi-plane independent read operation, e.g., an AMPI read operation, may be performed in an asynchronous manner on the plurality of planes 601 to increase a read speed. For the AMPI read operation, AMPI read instructions for reading from different planes 601 may be sent sequentially by a memory controller (e.g., the memory controller 106 in FIG. 1) to the memory device 300. Although a R/B_n signal may be set low to indicate that the memory device becomes busy when an AMPI read instruction for one plane, such as a plane 0, is received, additional AMPI read instructions for reading other planes, such as a plane 1, a plane 2, and a plane 3, may be still sent by the memory controller and processed by the memory device 300.

Figure 7:
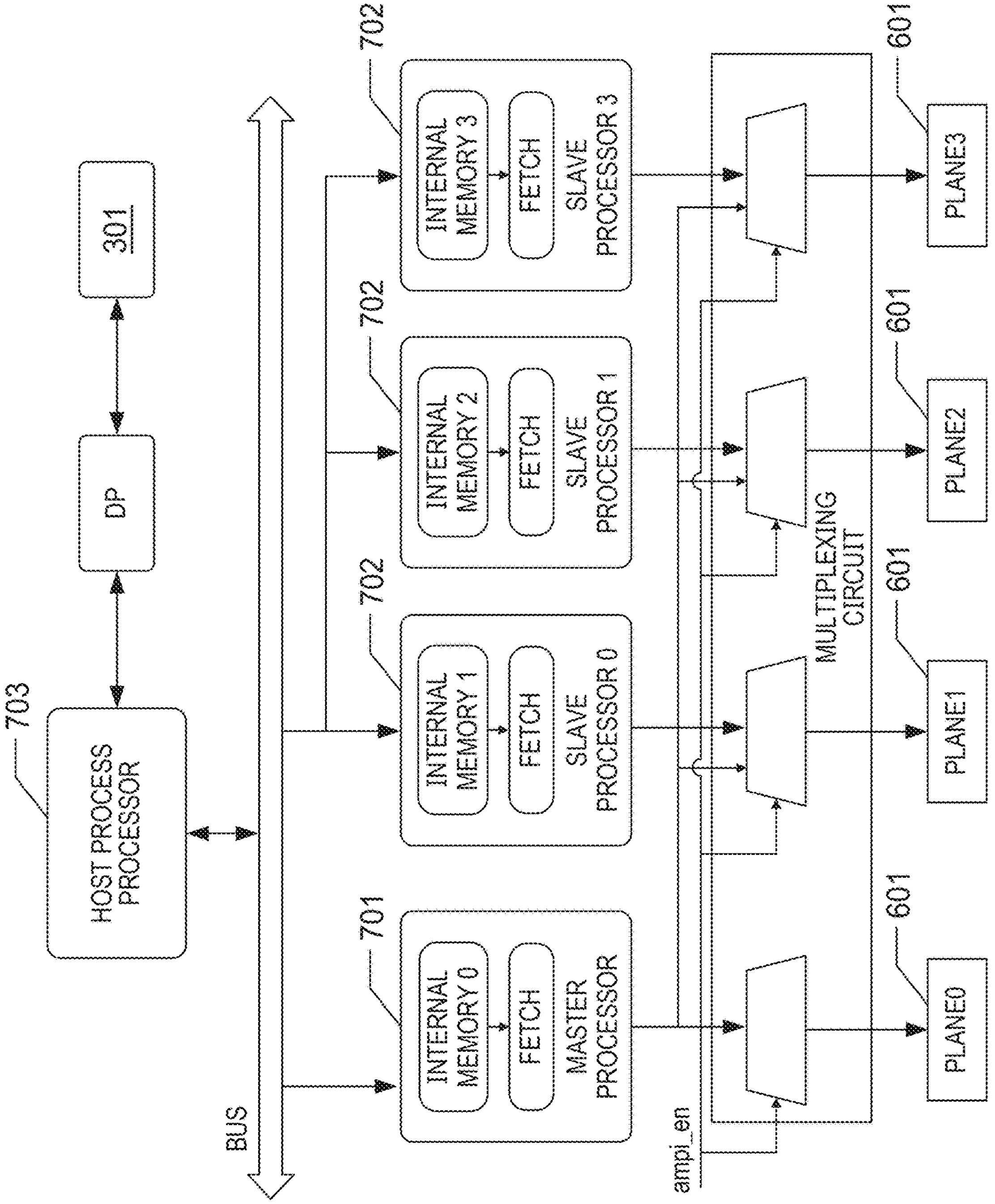
FIG. 7 is a schematic diagram I of an example memory device capable of performing an AMPI read operation and a non-AMPI read operation on a plurality of planes comprised in an example of the present application.

FIG. 7 is a schematic diagram I of an example memory device capable of performing an AMPI read operation and a non-AMPI read operation on a plurality of planes comprised in an example of the present application. The memory device 300 in FIG. 7 may be an example of the memory device 300 in FIGS. 3-6. The memory device 300 comprises a memory cell array 301 and a peripheral circuit coupled to the memory cell array. The memory cell array 301 and the peripheral circuit are coupled and transmit data through a data path (DP). The memory cell array 301 may comprise a plurality of the aforementioned planes 601. The number of the planes may be adjusted according to actual situations. In some examples, the number N of the planes may be 4, 6, 8, 10, etc. In the example shown in FIG. 7, the number of the planes is 4, e.g., a plane 0 (PLANE0), a plane 1 (PLANE1), a plane 2 (PLANE2), and a plane 3 (PLANE3). As described above with respect to FIG. 6, each plane 601 may comprise a set of circuits (e.g., the page buffer/sense amplifier 504, the column decoder/bit line driver 506, and the row decoder/word line driver 508). The set of peripheral circuits allows independent memory operations (e.g., at least one of read, program, or erase operations) on the memory cells in the plane 601.

In some examples, each plane 601 is configured to independently and asynchronously perform a read operation in response to receiving an AMPI read control signal. The non-AMPI read operation comprises a synchronous multi-plane independent (SMPI) read operation. Each plane is also configured to independently and synchronously perform the read operation in response to receiving an SMPI read control signal. That is to say, the plane 601 may perform different read operations according to different read control signals.

The peripheral circuit comprises the aforementioned control logic 512. The control logic 512 comprises N processors corresponding to the N planes. Each processor is configured with a corresponding internal memory. The N processors comprise one master processor 701 and N−1 slave processors 702. The N−1 internal memories corresponding to the N−1 slave processors have the same bus address.

Herein, the control logic 512 may comprise N−1 slave processors 702. That is to say, according to some implementations, the number of the slave processors 702 is one less than the number of the planes 601. For example, as shown in FIG. 7, the control logic 512 may comprise 3 slave processors 702 (a slave processor 0, a slave processor 1, and a slave processor 2). On the other hand, the control logic 512 further comprises a master processor 701, such that the total number of the master processor 701 and the slave processors 702 is the same as the number of the planes 601 as shown in FIG. 7. That is to say, the control logic 512 of the memory device in FIG. 7 represents an example of a general "1+(N−1)" architecture when performing the AMPI read operation and the non-AMPI read operation on the N planes, wherein "1" represents a single master processor 701, and "N−1" represents the number of the plurality of slave processors 702. As described in detail below, according to some implementations, when the AMPI read operation is performed, the master processor 701 and each of the N−1 slave processors 702 are respectively responsible for controlling the AMPI read operation of one respective plane 601. For example, the master processor 701 may be responsible for the plane 0, the slave processor 0 may be responsible for the plane 1, the slave processor 1 may be responsible for the plane 2, and the slave processor 2 may be responsible for the plane 3. It should be understood that mapping shown in FIG. 7 is for illustrative purposes only, any architecture of N planes 601, 1 master processor, and (N−1) slave processors is within the protection scope.

It is to be noted that the master processor 701 and the slave processors 702 may be discrete chips, or may also be an integrated chip system.

In some examples, the master processor 701 and the slave processors 702 all may be microcontroller units (MCUs), that is, the master processor 701 is a master MCU, and the slave processors 702 are Co-MCUs.

In some examples, the master processor 701 and the slave processors 702 may be also a e central processing unit (CPU) having multiple cores. That is, the master processor and the slave processors are cores of the CPU.

In some examples, the master processor 701 and the slave processors 702 may be also field programmable gate arrays (FPGAs), digital signal processing (DSP) chips, or application specific integrated circuits.

It should be understood that the master processor 701 and the slave processors 702 may be also any other suitable chips aside from the above-mentioned examples.

In some examples, the internal memories configured in the master processor 701 and the slave processors 702 are configured to store at least one of firmware codes or software codes for the respective processors during runtime. In some examples, the internal memories configured in the master processor 701 and the slave processors 702 may comprise at least one of any suitable ROM or any suitable RAM. In some examples, the internal memory comprises a RAM.

Due to different functions implemented, the bus address of the master processor is different from the bus addresses of the N−1 slave processors, and the N−1 slave processors have the same bus address.

As shown in FIG. 7, in some examples, the internal memory corresponding to the master processor 701 is coupled with a bus, and the bus address of the internal memory corresponding to the master processor 701 is a first bus address. The N−1 internal memories corresponding to the N−1 slave processors 702 are interconnected and all coupled with the bus, and the bus addresses of the N−1 internal memories corresponding to the N−1 slave processors 702 are all a second bus address.

In some examples, the master processor 701 is configured to provide an AMPI read control signal for the plane corresponding to the master processor 701 in the AMPI read operation process, and to provide a non-AMPI read control signal for each of the N planes in the non-AMPI read operation process.

In some examples, the N−1 slave processors 702 are configured to simultaneously receive instruction set data through the bus in a reset operation process, and provide AMPI read control signals for the respective plane of the N−1 planes based on the instruction set data in the read operation process. It may be understood that since the N−1 slave processors 702 load the instruction set data simultaneously, the loading duration can be significantly reduced compared with these internal memories loading the instruction set data one by one, thereby reducing the duration of the POR stage.

As shown in FIG. 7, in some implementations, the master processor 701 is configured to provide an AMPI read control signal for a plane (e.g., the plane 0) of the planes 601 to control the AMPI read operation for the plane 601 (e.g., the plane 0), and provide a non-AMPI read control signal for each plane 601 (e.g., the plane 0, the plane 1, the plane 2, and the plane 3) to control the non-AMPI read operation for each plane 601. The slave processors 702 are configured to provide AMPI read control signals for multiple planes (e.g., the plane 1, the plane 2, and the plane 3) of the planes 601 to control the AMPI read operation for the planes 601 (e.g., the plane 1, the plane 2, and the plane 3).

Herein, the control signals may comprise, for example, a signal to the page buffer/sense amplifier 504 to control data loading/unloading, a signal to the column decoder/bit line driver 506 to control the selection and driving of the bit lines, and a signal to the row decoder/word line driver 508 to control the selection and driving of the word lines. The non-AMPI read operation may comprise any suitable memory operation other than the AMPI read operation, including, for example, an SMPI read operation, program operation, or erase operation.

It is to be noted that each slave processor 702 may be used as an AMPI control unit responsible for processing AMPI read operation control for the respective plane 601 (e.g., the plane 1, the plane 2, and the plane 3). The master processor 701 may have at least dual functions: (1) acting as an AMPI control unit for processing the AMPI read operation control for the respective plane 601 (e.g., the plane 0), and (2) acting as a non-AMPI control unit for processing any non-AMPI read operation control for each plane 601 (e.g., the plane 0, the plane 1, the plane 2, and the plane 3). It should be understood that as a general processing unit of the control logic 512, the master processor 701 can perform any other suitable functions of the control logic 512 aside from the AMPI read operation control and the non-AMPI read operation control.

As shown in FIG. 7, in some examples, the peripheral circuit further comprises a host process processor 703. The host process processor 703 is coupled with the bus and is configured to acquire, in response to a reset instruction, instruction set data from the memory cell array 301, send, through the bus, instruction set data of the acquired instruction set data matched with the first bus address into the master processor 701, and simultaneously send instruction set data matched with the second bus address into the N−1 slave processors 702.

Herein, the host process processor 703 mainly controls the main flow of all operations, including data loading in the POR stage. The host process processor 703 acquires the instruction set data from the blocks configured in the memory cell array 301, and writes, through the bus, the instruction set data of the acquired instruction set data matched with the master processor 701 into the internal memory (e.g., the internal memory 0) of the master processor 701, and simultaneously writes the instruction set data matched with the slave processors 702 into the internal memories (e.g., the internal memory 1, the internal memory 2, and the internal memory 3) of the N−1 slave processors 702. An implementation device of the host process processor 703 is similar to implementation devices of the aforementioned master processor 701 and slave processors 702, which is no longer repeated herein.

In some examples, the host process processor 703 may receive a reset instruction at an instant when the host process processor 703 is powered on or at other instants when a reset is needed.

In the examples of the present application, the host process processor 703 (e.g., an MP MCU) acquires data from the blocks configured in the memory cell array, and then writes, through the BUS (a channel mainly for data transmission), the data to the master processor (e.g., the master MCU) and the slave processors (e.g., Co-MCUs) matched with the bus address, wherein RAMs of all the slave processors (e.g., all Co-MCUs) share one bus address, and data of RAMs of all the slave processors (e.g., all the Co-MCUs) is loaded simultaneously in the POR stage. The master processor (e.g., the master MCU) processes non-asynchronous independent read like traditional multi-plane read, and processes one plane (e.g., the plane 0) in the AMPI. In the AMPI, the plurality of slave processors process the remaining other planes (e.g., the plane 1, the plane 2, and the plane 3) respectively. It may be understood that sharing the addresses of all the slave processors (e.g., all the Co-MCUs) can solve the problem of an insufficient bus address space, thereby avoiding the occupation of more routing resources caused by the increase in a bus bit width as the number of the planes increases. In the POR stage, all the slave processors (e.g., all the Co-MCUs) can load data simultaneously, which can save the duration of the POR stage, thereby improving the performance of the memory device.

It is to be noted that based on different functions, the firmware stored in the ROM and RAM by the master processor (e.g., the master MCU) is different from the firmware stored in the ROM and RAM by the slave processors. All the slave processors (e.g., all the Co-MCUs) store the same firmware in the ROMs and RAMs. The RAMs of all the slave processors (e.g., all the Co-MCUs) use one bus address, and the host process processor (e.g., the MP MCU) can simultaneously write data to the RAMs of all the slave processors (e.g., all the Co-MCUs) through the BUS. This change has no impact on RAM reading because RAM reading is based on a value in a dedicated register (e.g., a program counter (PC)) of each slave processor (e.g., the Co-MCU). Herein, the PC is used to store an address of an instruction to be executed currently, has a direct path to the host process processor (e.g., the MP MCU), and has a function of adding one, which can generate an address of a next instruction.

Figure 8:
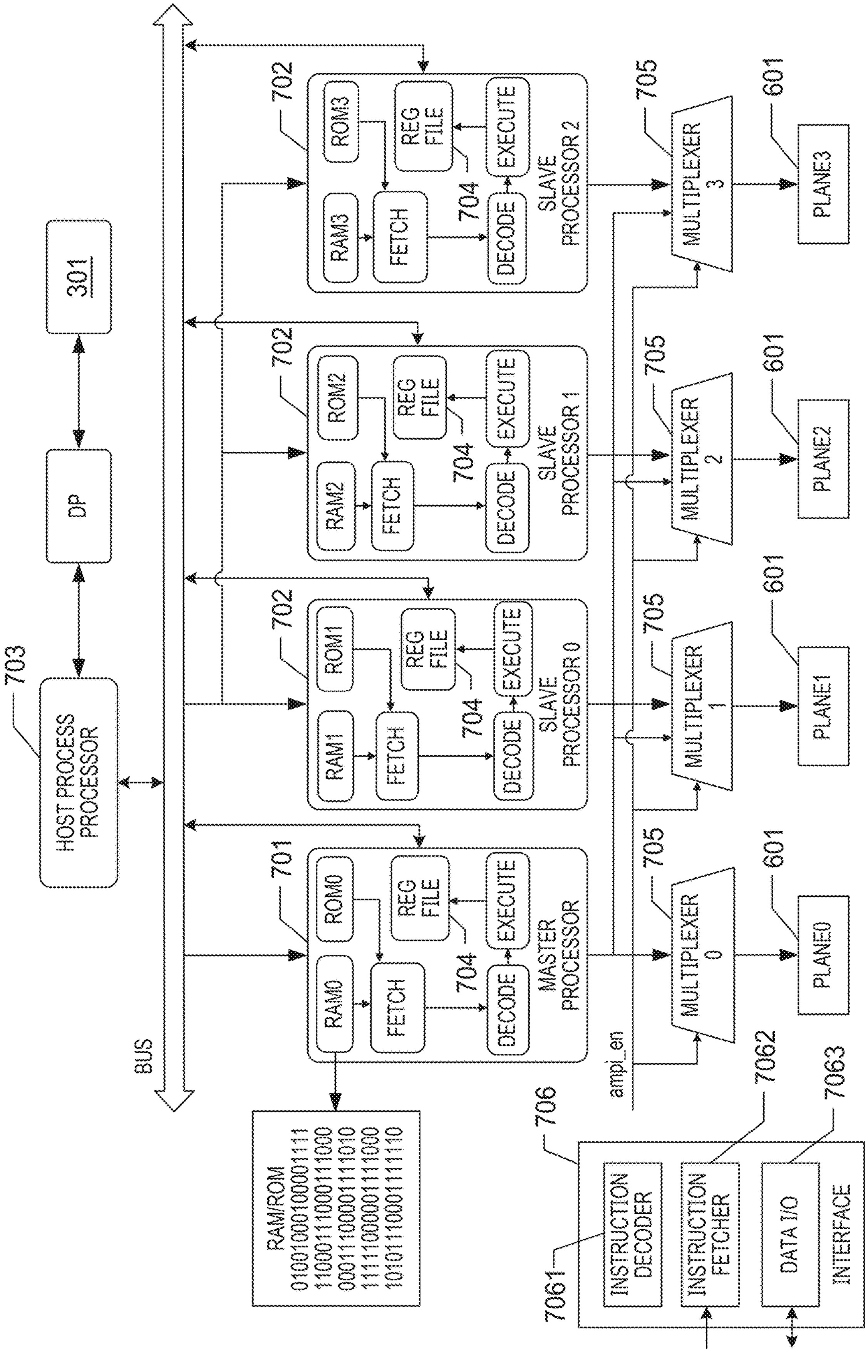
FIG. 8 is a schematic diagram II of an example memory device capable of performing an AMPI read operation and a non-AMPI read operation on a plurality of planes comprised in an example of the present application.

FIG. 8 is a schematic diagram II of an example memory device capable of performing an AMPI read operation and a non-AMPI read operation on a plurality of planes comprised in an example of the present application.

As shown in FIG. 8, in some examples, each of the processors is configured with a corresponding register group 704, wherein the N−1 register groups 704 corresponding to the N−1 slave processors have different bus addresses; and the register group 704 is configured to store an address of an instruction to be executed currently.

Herein, the register group 704 (REGFILE), also referred to as a register bank or register file, is an array consisting of a plurality of registers in the processor. The register group 704 is at least configured to store the address of the instruction to be executed currently. The bus address of the register group 704 corresponding to each processor is different, that is, the register group corresponding to each processor is directly connected with the bus, thereby allowing for direct interaction with the host process processor. Since the register group in each of the processors, including the master processor 701 and each slave processor 702, can directly interact with the process processor, in the AMPI read operation process of each processor, although the instruction set data stored in the RAM corresponding to each slave processor 702 is consistent, the address of the instruction to be executed currently that is stored in the register group 704 in each slave processor 702 may be different, thereby achieving asynchronous control by each slave processor 702 without interference.

For example, in the examples of the present application, the RAM corresponding to each slave processor 702, rather than each slave processor, mainly shares the bus address. The remaining devices other than the RAM corresponding to each slave processor 702, such as the register group 704, may be independently connected with the bus respectively.

It is to be further noted that for ease of a corresponding understanding, the internal memory corresponding to the processor is directly classified into the processor in the drawings of the examples of the present application. In some examples, the internal memory corresponding to the processor may be also classified outside the processor.

As mentioned earlier, the master processor 701 has different functions for the AMPI read operation and the non-AMPI read operation. In order to achieve different functions of the master processor 701, in some examples, the peripheral circuit further comprises a multiplexing circuit. The multiplexing circuit is coupled with the N processors and the N planes, and is configured to output each of the N AMPI read control signals from the corresponding one of the N processors to the respective plane in the AMPI read operation process; and output the non-AMPI read control signal from the master processor to each plane in the non-AMPI read operation process.

In some examples, as shown in FIG. 7, the multiplexing circuit is connected with the N processors and the N planes, and is configured to transmit the respective read control signals to the respective planes in different reading scenarios.

In some examples, the multiplexing circuit comprises N multiplexers 705. A first input end of each of the N multiplexers 705 is configured to receive the non-AMPI read control signal from the master processor 701. A second input end of each multiplexer 705 is configured to receive the AMPI read control signal from the master processor 701 or the slave processor 702. An output end of each multiplexer 705 is coupled with the respective one of the N planes.

In some examples, as shown in FIG. 8, the memory device may further comprise a multiplexer 705. The multiplexer 705 is connected with the planes 601 (e.g., N=4, the plane 0, the plane 1, the plane 2, and the plane 3), the master processor 701, and the slave processors 702 (e.g., N−1=3, the slave processor 0, the slave processor 1, and the slave processor 2), and is configured to output control signals from the master processor 701 or the corresponding slave processors 702 to the corresponding planes 601. Since the master processor 701 can control the AMPI read operation and the non-AMPI read operation of the corresponding plane 601 (e.g., the plane 0), in some implementations, the multiplexer 705 comprises a one-to-one connection between the master processor 701 and the corresponding plane 601 (e.g., the plane 0). For the other 3 planes 601 (e.g., the plane 1, the plane 2, and the plane 3), the multiplexer 705 may comprise 3 multiplexers (MUX) that couple the 3 slave processors 702 to the 3 planes 601 respectively. Each MUX may also couple the master processor 701 to the corresponding plane 601. That is to say, each MUX may comprise an output end connected to the respective planes 601 (e.g., the plane 1, the plane 2, and the plane 3), a first input end that receives the non-AMPI read control signal from the master processor 701, and a second input end that receives the AMPI read control signal from the respective slave processor 702. For example, the two input ends of one MUX can be respectively connected to the master processor 701 and the corresponding slave processor 702 (e.g., the slave processor 0), and the output end of the MUX can be connected to the corresponding plane 601 (e.g., the plane 1), such that the AMPI read control signal provided by the slave processor 702 or the non-AMPI read control signal provided by the master processor 701 may be selected/enabled and outputted to the corresponding plane 601.

It is to be noted that in FIG. 8, both the first input end and the second input end of the multiplexer (e.g., the multiplexer 0) corresponding to the master processor are connected with the master processor 701. The first input end and the second input end of the multiplexer 0 are shown as the same input end in FIG. 8.

As shown in FIG. 8, each MUX of the multiplexer 705 is also configured to receive a control signal (ampi_en) to select/enable one of two input signals. For example, when the control signal is set high (e.g., ampi_en is enabled), each MUX of the multiplexer 705 can enable the corresponding AMPI read control signal to be outputted from the second input end to the corresponding plane (e.g., the plane 1, the plane 2, and the plane 3). When the control signal is set low (e.g., ampi_en is disabled), each MUX of the multiplexer 705 can enable the same non-AMPI read control signal to be outputted from the first input end to the corresponding plane (e.g., the plane 1, the plane 2, and the plane 3).

In some examples, the peripheral circuit further comprises an interface 706. The interface 706 is coupled with the multiplexing circuit, and is configured to control the multiplexing circuit to output each AMPI read control signal from the corresponding processor to the respective plane in the AMPI read operation process, and output the non-AMPI read control signal from the master processor to each plane in the non-AMPI read operation process.

In some examples, the interface 706 comprises an instruction decoder 7061. The instruction decoder 7061 is configured to control, in response to receiving an AMPI read instruction, the master processor 701 and the slave processors 702 to generate corresponding AMPI read control signals based on the AMPI read instruction, and control the multiplexer 705 to output the corresponding AMPI read control signal received from the second input end. The instruction decoder 7061 is further configured to control, in response to receiving a non-AMPI read instruction, the master processor 701 to generate the non-AMPI read control signal based on the non-AMPI read instruction, and control each multiplexer 705 to output the non-AMPI read control signal received from the first input end.

In some examples, as shown in FIG. 8, the interface 706 comprises an instruction decoder 7061, an instruction fetcher 7062, and a data input/output (I/O) 7063. The interface 706 can be used as an instruction/control interface through the instruction decoder 7061 and the instruction fetcher 7062 (collectively referred to as an instruction processing unit (IPU)), and also as a data interface through the data I/O 7063. In some implementations, the data I/O 7063 is connected with at least one of a host (e.g., the host 108 in FIG. 1) or a memory controller (e.g., the memory controller 106 in FIG. 1), and is configured to receive data to be stored into the plane 601 and relay the data to the data bus 518 during the program operation, and receive, from the data bus 518, data read from the plane 601 and relay the read data to at least one of the host or the memory controller during the AMPI read operation or SMPI read operation. On the other hand, according to some implementations, the instruction fetcher 7062 is configured to receive instructions from at least one of the host (the host 108 in FIG. 1) or the memory controller (e.g., the memory controller 106 in FIG. 1). The instructions comprise an AMPI read instruction and a non-AMPI read instruction (e.g., an SMPI read instruction, a program instruction, or an erase instruction). Then, the instruction fetcher 7062 may forward the instructions to the instruction decoder 7061.

In some implementations, the instruction decoder 7061 is configured to decode each instruction, and control operations of the control logic 512 and the multiplexer 705 based on the decoded instruction. Based on the decoded instruction, the instruction decoder 7061 may control the generation of the AMPI read control signal and the non-AMPI read control signal by the control logic 512. In some implementations, in response to obtaining the AMPI read instruction during decoding, the instruction decoder 7061 controls one of the master processor 701 or the slave processor 702 to generate the corresponding AMPI read control signal based on the decoded AMPI read instruction. In some implementations, in response to obtaining the non-AMPI read instruction during decoding, the instruction decoder 7061 controls the master processor 701 to generate the non-AMPI read control signal based on the decoded non-AMPI read instruction.

Based on the decoded instruction, the instruction decoder 7061 may also control the MUX of the multiplexers 705 by enabling or disabling the control signal to the MUX (e.g., ampi_en). In some implementations, in response to obtaining the AMPI read instruction during decoding, the instruction decoder 7061 controls each MUX of the multiplexers 705 to enable the output of the corresponding AMPI read control signal from the corresponding slave processor 702 by enabling the control signal. In some implementations, in response to obtaining the non-AMPI read instruction during decoding, the instruction decoder 7061 controls each MUX of the multiplexers 705 to enable the output of the non-AMPI read control signal from the master processor 701 by disabling the control signal. For example, during the performance of the non-AMPI read operation (the non-AMPI read instruction), the instruction decoder 7061 may cause the master processor 701 to provide a non-AMPI read control signal to each plane 601; and during the performance of the AMPI read operation (the AMPI read instruction), the instruction decoder 7061 may enable the master processor 701 or the slave processor 702 to provide an AMPI read control signal to the corresponding plane 601. As a result, in some implementations, the interface 706 is coupled to the multiplexer 705 and configured to control the multiplexer 705 to output the non-AMPI read control signal from the master processor 701 to each plane 601 during the non-AMPI read operation, and output each of the AMPI read control signals from the master processor 701 or the corresponding slave processor 702 to the respective plane 601 during the AMPI read operation.

In the various examples in the present application, the internal memories of all the slave processors corresponding to the planes share one bus address. In a reset stage, the instruction set data for all the slave processors is loaded simultaneously, such that each plane is separately controlled without increasing an address bus width in the AMPI read operation process, while the data of all the slave processors is written, thereby reducing a duration of the reset stage and improving the performance of the memory device.

Examples of the present application further provide a memory system, comprising:

one or more memory devices provided by the examples of the present application; and a memory controller coupled with and controlling the memory device.

Herein, the internal composition of the memory system may be understood with reference to the memory system 102 in FIG. 1 mentioned above, and some application scenarios about the memory system may be understood with reference to FIG. 2A and FIG. 2B mentioned above, which are no longer repeated herein.

In some examples, the memory system comprises a universal flash storage (UFS) device or a solid state disk (SSD). The memory device comprises a NAND memory.

Figure 9:
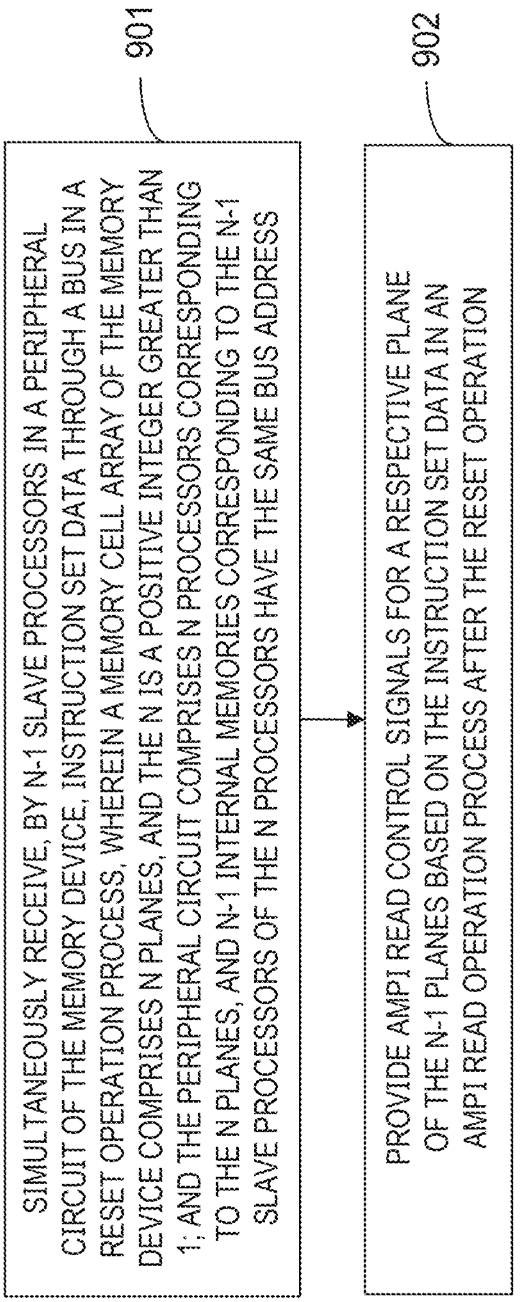
FIG. 9 is a flow diagram of implementing an operation method of a memory device comprised in an example of the present application.

Examples of the present application further provide an operation method of a memory device. As shown in FIG. 9, the operation method comprises:

Operation 901: simultaneously receiving, by N−1 slave processors in a peripheral circuit of the memory device, instruction set data through a bus in a reset operation process, wherein a memory cell array of the memory device comprises N planes, and N is a positive integer greater than 1; and the peripheral circuit comprises N processors corresponding to the N planes, and N−1 internal memories corresponding to the N−1 slave processors among the N processors have the same bus address; and Operation 902: providing AMPI read control signals for a respective plane of the N−1 planes based on the instruction set data in an AMPI read operation process after the reset operation.

Herein, the memory device comprises the N processors, and the N processors comprise one master processor and the N−1 slave processors. The N processors are configured with corresponding internal memories, wherein the bus address of the master processor is different from the bus addresses of the N−1 slave processors.

It is to be noted that the composition and configuration of the memory device may be understood with reference to the aforementioned examples.

In some examples, the operation method further comprises: acquiring, by a host process processor in the peripheral circuit, instruction set data at least from the memory cell array in response to a reset instruction; and sending, through the bus, instruction set data of the acquired instruction set data matched with a first bus address into the master processor of the N processors, and simultaneously sending the instruction set data matched with a second bus address into the N−1 slave processors.

In some examples, the operation method further comprises: acquiring, by the N−1 slave processors, an address of an instruction to be executed currently through corresponding N−1 register groups respectively in the AMPI operation process, wherein the N−1 register groups corresponding to the N−1 slave processors have different bus addresses.

The bus address of the register group corresponding to each processor is different, that is, the register group corresponding to each processor is directly connected with the bus, thereby allowing for direct interaction with the host process processor. Since the register group in each of the processors, including the master processor and each slave processor, can directly interact with the process processor, in the AMPI read operation process of each processor, although the instruction set data stored in the RAM corresponding to each slave processor is consistent, the address of the instruction to be executed currently that is stored in the register group of each slave processor may be different, thereby achieving asynchronous control by each slave processor without interference. For example, in the examples of the present application, the RAM corresponding to each slave processor, rather than each slave processor, mainly shares the bus address. The remaining devices other than the RAM corresponding to each slave processor, such as the register group, may be independently connected with the bus.

In some examples, the operation method further comprises: providing, by the master processor of the N processors, the AMPI read control signal for the plane corresponding to the master processor in the AMPI read operation process; providing a non-AMPI read control signal for each of the N planes in the non-AMPI read operation process; outputting, by a multiplexing circuit of the peripheral circuit, each of the N AMPI read control signals from the corresponding one of the N processors to the respective plane in the AMPI read operation process; and outputting the non-AMPI read control signal from the master processor to each plane in the non-AMPI read operation process.

In some examples, the operation method further comprises: controlling, by an interface of the peripheral circuit, the multiplexing circuit to output each AMPI read control signal from the corresponding processor to the respective plane in the AMPI read operation process, and output the non-AMPI read control signal from the master processor to each plane in the non-AMPI read operation process.

It is to be understood that “one example” and “an example” mentioned in the whole specification mean that features, structures, or characteristics related to the example is included in at least one example of the present application. Therefore, “in one example” or “in an example” appearing at any place of the whole specification does not always refer to the same example. In addition, these features, structures, or characteristics may be combined in one or more examples in any proper manner. It is to be understood that, in various examples of the present application, sequence numbers of the above processes do not indicate an execution sequence, and an execution sequence of various processes shall be determined by functionalities and intrinsic logics thereof, and shall constitute no limitation on an implementation process of the examples of the present application. The above sequence numbers of the examples of the present application are only for description, and do not represent goodness and badness of the examples.

The methods disclosed in several method examples as provided by the present application may be combined freely to obtain new method examples in case of no conflicts.

The above descriptions are merely implementations of the present application, but the protection scope of the present application is not limited to these. Any variation or replacement readily figured out by those skilled in the art within the technical scope as disclosed by the present application shall fall within the protection scope of the present application. Therefore, the protection scope of the present application shall be subject to the protection scope of the claims.

What is claimed is:

1. A memory device, comprising:

a memory cell array comprising N planes, wherein N is a positive integer greater than 1; and a peripheral circuit coupled to the memory cell array and comprising:

a host process processor coupled to the memory cell array and a bus; and

N processors corresponding to the N planes, wherein each of the N processors comprises an internal memory, wherein the N processors comprise one master processor and N−1 slave processors, and wherein N−1 internal memories corresponding to the N−1 slave processors are interconnected, coupled to the bus, and have a same bus address, wherein the N−1 internal memories are configured to simultaneously store same instruction set data received through the bus using the same bus address, and wherein the N−1 slave processors comprise respective register groups configured to store different addresses of instructions to be executed currently from the same instruction set data.

2. The memory device of claim 1, wherein the N−1 slave processors are configured to:

simultaneously receive instruction set data through a bus in a reset operation process; and provide asynchronous multi-plane independent (AMPI) read control signals for a respective plane based on the instruction set data in an AMPI read operation process.

3. The memory device of claim 1, wherein the internal memory corresponding to the master processor is coupled to the bus, and a bus address of the internal memory corresponding to the master processor is a first bus address; and a bus address of each of the N−1 internal memories corresponding to the N−1 slave processors is a second bus address.

4. The memory device of claim 3, wherein the host process processor is configured to:

acquire, in response to a reset instruction, instruction set data from the memory cell array;

send, through the bus, a first instruction set data of the instruction set data into the master processor, wherein the first instruction set data matched with the first bus address; and simultaneously send a second instruction set data of the instruction set data into the N−1 slave processors, wherein the second instruction set data matched with second bus address.

5. The memory device of claim 3, wherein the master processor is configured to:

provide an AMPI read control signal for a plane corresponding to the master processor in an AMPI read operation process, and provide a non-AMPI read control signal for each of the N planes in a non-AMPI read operation;

the peripheral circuit further comprises a multiplexing circuit; and the multiplexing circuit is coupled to the N processors and the N planes, and is configured to:

output each of N AMPI read control signals from a corresponding one of the N processors to a respective plane in the AMPI read operation process, and output the non-AMPI read control signal from the master processor to each of the N planes in the non-AMPI read operation.

6. The memory device of claim 5, wherein the peripheral circuit further comprises an interface; and the interface is coupled to the multiplexing circuit, and is configured to:

control the multiplexing circuit to output each of the N AMPI read control signals from a corresponding processor to the respective plane in the AMPI read operation process, and output the non-AMPI read control signal from the master processor to each of the N planes in the non-AMPI read operation process.

7. The memory device of claim 6, wherein each of the N planes is configured to independently and asynchronously perform a read operation in response to receiving the AMPI read control signal; and independently and synchronously perform the read operation in response to receiving a synchronous multi-plane independent (SMPI) read control signal.

8. The memory device of claim 7, wherein the multiplexing circuit comprises N multiplexers, a first input end of each of the N multiplexers is configured to receive the non-AMPI read control signal from the master processor, a second input end of each multiplexer is configured to receive the AMPI read control signal from one of the N processors.

9. The memory device of claim 8, wherein the interface comprises an instruction decoder configured to:

control, in response to receiving an AMPI read instruction, the N processors to generate a corresponding AMPI read control signal based on the AMPI read instruction, and control the multiplexer to output a corresponding AMPI read control signal received from the second input end; and the instruction decoder is further configured to:

control, in response to receiving a non-AMPI read instruction, the master processor to generate the non-AMPI read control signal based on the non-AMPI read instruction, and control each multiplexer to output the non-AMPI read control signal received from the first input end.

10. The memory device of claim 1, wherein each of the N−1 slave processors is configured with a corresponding register group, and N−1 register groups corresponding to the N−1 slave processors have different bus addresses.

11. The memory device of claim 1, wherein the internal memory comprises a random access memory (RAM).

12. A memory system, comprising:

one or more memory devices, comprising:

a memory cell array comprising N planes, wherein N is a positive integer greater than 1; and a peripheral circuit coupled to the memory cell array and comprising:

a host process processor coupled to the memory cell array and a bus; and

N processors corresponding to the N planes, wherein each of the N processors comprises an internal memory, wherein the N processors comprise one master processor and N−1 slave processors, and wherien N−1 internal memories corresponding to the N−1 slave processors are interconnected, coupled to the bus, and have a same bus address, wherein the N−1 internal memories are configured to simultaneously store same instruction set data received through the bus using the same bus address, and wherein the N−1 slave processors comprise respective register groups configured to store different addresses of instructions to be executed currently from the same instruction set data; and a memory controller coupled to the memory device and configured to control the memory devices.

13. The memory system of claim 12, wherein the N−1 slave processors are configured to:

simultaneously receive instruction set data through a bus in a reset operation process; and provide asynchronous multi-plane independent (AMPI) read control signals for a respective plane based on the instruction set data in an AMPI read operation process.

14. The memory system of claim 12, wherein the internal memory corresponding to the master processor is coupled to the bus, and a bus address of the internal memory corresponding to the master processor is a first bus address; and a bus address of each of the N−1 internal memories corresponding to the N−1 slave processors is a second bus address.

15. The memory system of claim 14, wherein the host process processor is configured to:

acquire, in response to a reset instruction, instruction set data from the memory cell array, send, through the bus, a first instruction set data of the instruction set data into the master processor, wherein the first instruction set data matched with the first bus address, and simultaneously send a second instruction set data of the instruction set data into the N−1 slave processors, wherein the second instruction set data matched with second bus address.

16. The memory system of claim 14, wherein the master processor is configured to:

provide an AMPI read control signal for a plane corresponding to the master processor in an AMPI read operation process, and provide a non-AMPI read control signal for each of the N planes in a non-AMPI read operation process;

the peripheral circuit further comprises a multiplexing circuit; and the multiplexing circuit is coupled to the N processors and the N planes, and is configured to:

output each of N AMPI read control signals from a corresponding one of the N processors to a respective plane in the AMPI read operation process, and output the non-AMPI read control signal from the master processor to each of the N planes in the non-AMPI read operation process.

17. An operation method of a memory device, comprising:

simultaneously receiving, by N−1 slave processors in a peripheral circuit of the memory device, instruction set data through a bus in a reset operation process, wherein a memory cell array of the memory device comprises N planes, N is a positive integer greater than 1, the peripheral circuit comprises a host process processor and N processors corresponding to the N planes, wherein N−1 internal memories corresponding to the N−1 slave processors of the N processors are interconnected, coupled to the bus, and have a same bus address;

storing the same instruction set data simultaneously in the N−1 internal memories using the same bus address;

during an asynchronous multi-plane independent (AMPI) read operation process, executing, by the N−1 slave processors, instructions identified by different current-instruction addresses stored in respective register groups of the N−1 slave processors; and providing AMPI read control signals for a respective plane based on the instruction set data in an AMPI read operation process after the reset operation process.

18. The operation method of claim 17, wherein the operation method further comprises:

acquiring, by the host process processor in the peripheral circuit, instruction set data from the memory cell array in response to a reset instruction, sending, through the bus, a first instruction set data of the instruction set data into a master processor of the N processors, wherein the first instruction set data matched with a first bus address, and simultaneously sending a second instruction set data of the instruction set data into N−1 slave processors of the N processors, wherein the second instruction set data matched a second bus address.

19. The operation method of claim 17, further comprising:

respectively acquiring, by N−1 slave processors of the N processors, an address of an instruction to be executed currently through corresponding N−1 register groups in the AMPI operation process, wherein the N−1 register groups corresponding to the N−1 slave processors have different bus addresses.

20. The operation method of claim 17, further comprising:

providing, by a master processor of the N processors, an AMPI read control signal for a plane corresponding to the master processor in the AMPI read operation process;

providing a non-AMPI read control signal for each of the N planes in a non-AMPI read operation process;

outputting, by a multiplexing circuit in the peripheral circuit, each of N AMPI read control signals from a corresponding processor of the N processors to a respective plane in the AMPI read operation process; and outputting the non-AMPI read control signal from the master processor to each of the N planes in the non-AMPI read operation process.

* * * * *